United States Patent [19]

Alcorn et al.

[11] Patent Number: 4,543,442
[45] Date of Patent: Sep. 24, 1985

[54] GAAS SCHOTTKY BARRIER PHOTO-RESPONSIVE DEVICE AND METHOD OF FABRICATION

[75] Inventors: George E. Alcorn, Reston, Va.; Charles Z. Leinkram, Bowie, Md.; Olatunji Okunola, Orlando, Fla.

[73] Assignee: The United States of America as represented by the Administrator of the National Aeronautics and Space Administration, Washington, D.C.

[21] Appl. No.: 507,625

[22] Filed: Jun. 24, 1983

[51] Int. Cl.$^4$ ............................................. H01L 31/06
[52] U.S. Cl. ...................... 136/255; 29/572; 136/262; 357/15; 357/30
[58] Field of Search ...................... 29/572; 427/74, 84; 136/255, 262; 357/15, 30

[56] References Cited

U.S. PATENT DOCUMENTS

| | | | |
|---|---|---|---|
| 1,959,073 | 8/1933 | Williams | 136/255 |
| 3,290,127 | 12/1966 | Kahng et al. | 428/609 |
| 3,349,297 | 10/1967 | Crowell et al. | 357/15 |
| 3,636,417 | 1/1972 | Kimura | 357/15 |
| 3,757,123 | 10/1973 | Archer et al. | 250/338 |
| 3,887,935 | 6/1975 | Fischer et al. | 136/244 |
| 4,000,505 | 12/1976 | Epstein et al. | 136/255 |
| 4,053,918 | 10/1977 | Fletcher | 136/255 |
| 4,062,698 | 12/1977 | Blakeslee et al. | 136/246 |
| 4,098,921 | 7/1978 | Calviello | 427/53.1 |
| 4,104,084 | 8/1978 | Evans | 136/256 |
| 4,139,857 | 2/1979 | Tagaki et al. | 357/15 |
| 4,162,505 | 7/1979 | Hanak | 357/30 |
| 4,278,830 | 7/1981 | Frosch et al. | 136/255 |

FOREIGN PATENT DOCUMENTS

| | | | |
|---|---|---|---|
| 56-133881 | 10/1981 | Japan | 136/255 |
| 1426395 | 2/1976 | United Kingdom | 357/15 A |

OTHER PUBLICATIONS

P. Sircar et al., *Canadian J. Phys.*, vol. 59, pp. 716–717, (1981).
K. A. Pandelisev et al., *J. Appl. Phys.*, vol. 53, pp. 720–723, (1982).
W. A. Anderson et al., *Solid State Electronics*, vol. 19, pp. 973–974, (1976).

*Primary Examiner*—Aaron Weisstuch
*Attorney, Agent, or Firm*—John O. Tresansky; John R. Manning; Robert E. Bushnell

[57] ABSTRACT

A gallium arsenide photo-responsive device (40) is provided with an intermediate, transparent layer (28) of refractory metal or alkaline earth metal forming a tenacious bond between a non-hydroscopic oxide layer (24) and a noble metal Schottky barrier layer (30). The device has a gallium arsenide substrate with a predetermined type conductivity and a gallium arsenide epitaxial layer (16) with the same type conductivity but a lower charge carrier concentration grown on the substrate. The oxide layer (24) is formed to cover the epitaxial layer (16) and the transparent metal layer (28) followed by the noble metal layer (30) are deposited upon the oxide layer. An interdigitated ohmic contact (32) is then formed upon the noble metal layer.

8 Claims, 8 Drawing Figures

GAAS SCHOTTKY BARRIER PHOTO-RESPONSIVE DEVICE AND METHOD OF FABRICATION

ORIGIN OF THE INVENTION

The invention described herein was made by an employee of the United States Government as well as in the performance of work under a NASA Contract and is subject to the provisions of Section 305 of the National Aeronautics and Space Act of 1958, Public Law 85-568 (72 Stat. 435; 42 U.S.C. 2457) and accordingly may be manufactured and used by or for the Government for governmental purposes without the payment of any royalties thereon or therefor.

TECHNICAL FIELD

The invention generally relates to a photo-responsive cell and, more particularly, to a gallium arsenide Schottky barrier device and to a method of fabricating the device.

BACKGROUND ART

In recent years, semiconductor devices using metal-semiconducting barriers, known as Schottky barriers, instead of p/n junctions, have been developed to convert incident light, such as solar radiation, into electrical energy. Such devices, commonly referred to as Schottky-barrier type cells, are distinguishable from p/n junction devices by simplicity of fabrication, higher current output and improved radiation resistance.

Typically, a Schottky barrier type cell includes a substrate made from a single crystal wafer of gallium arsenide (GaAs). The bottom surface of the wafer is metallized to form one terminal of the cell and a thin, semiconducting layer of gallium arsenide is epitaxially grown on the top surface of the wafer. A layer of an oxide is deposited on top of the epitaxial gallium arsenside layer and a very thin layer of a noble metal is deposited on the oxide layer. Very thin layers (less than 100 angstrom units) of noble metals are able to transmit light. A metal grid electrode is then formed on the layer of noble metal to serve as the other terminal of the cell. Often, an anti-reflection coating is applied to the exposed surface of the metal layer.

Schottky barrier devices constructed in this manner suffer from a major defect: none of the noble metals adhere well to an oxide layer covering the epitaxial gallium arsenide layer. Efforts to avoid this defect by making devices without an oxide layer between the gallium arsenide epitaxial layer and the noble metal have been unsatisfactory because the noble metals adhere well to the epitaxial layer only after annealing, a step that usually destroys the stoichiometry of the epitaxial layer. Consequently, it is extremely difficult to either package or electrically couple an unannealed device to an external circuit because the noble metal layer tends to lift away from the device whenever an electrical lead is bonded to the grid electrode, thus causing an undesirable open circuit between the metal layer and the device.

STATEMENT OF INVENTION

Accordingly, it is an object of the present invention to provide an improved gallium arsenide Schottky barrier photo-responsive device.

It is still another object to provide improved adhesion between metal and oxide layers in a gallium arsenide Schottky barrier photo-responsive device.

It is still object to provide a gallium arsenide Schottky barrier photo-responsive device which can be easily coupled to an external circuit.

It is also an object to provide a process for improving adhesion between metal and semiconducting layers of a gallium arsenide Schottky barrier photo-responsive device.

These and other objects are achieved with a gallium arsenside Schottky barrier photo-responsive device having an intermediate metal bond between a noble metal layer and an insulating oxide layer which bond is made with a transparent layer of either a refractory metal or alkaline earth metal, depending upon the conductivity type of the gallium arsenide, deposited directly upon the oxide layer, and a very thin layer of the noble metal deposited over the transparent layer.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, and wherein.

DETAILED DESCRIPTION OF THE INVENTION

Figure 1A:
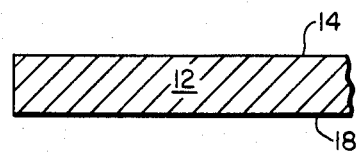
FIGS. 1a through 1f are cross-sectional views showing an embodiment of the invention at various stages of fabrication.
Figure 1B:
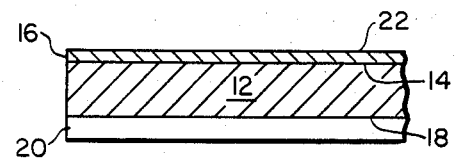
Figure 1C:
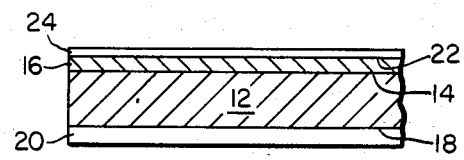
Figure 1D:
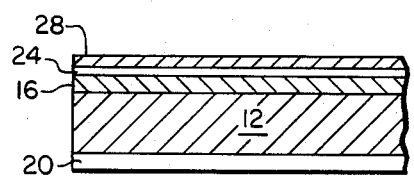
Figure 1E:
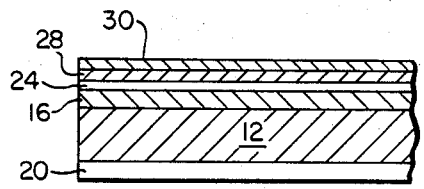
Figure 1F:
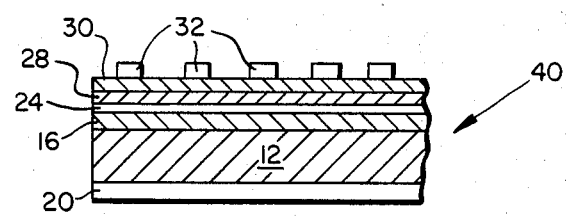

Refer now to the drawings and, in particular, to FIGS. 1a through 1f which sequentially illustrate several steps in the fabrication of a gallium arsenide Schottky barrier photo-responsive device. The device is fabricated on a substrate 12 of a highly doped gallium arsenside wafer having an n+ type conductivity with a majority charge carrier concentration of approximately $10^{17}$ carriers per cubic centimeter. The substrate 12 is cleaned and etched to present a stoichiometric top surface 14 upon which an n type conductivity gallium arsenide epitaxial layer 16, shown in FIG. 1b, is grown by well known methods such as liquid phase epitaxy, to a thickness of between approximately one and twenty microns. As grown, gallium arsenide epitaxial layer 16 has a majority charge carrier concentration of about $10^{16}$ carriers per cubic centimeter.

After growth of epitaxial layer 16, the substrate is treated to remove excess gallium from the epitaxial layer. The bottom surface 18 of the substrate is then cleaned and an ohmic contact 20 is deposited thereon by well known methods, such as vacuum deposition, to a thickness of between several hundred and a few thousand angstrom units. The ohmic contact, typically made of an electrically conducting material such as a gold-germanium eutectic alloy, is then annealed into bottom surface 18 at a temperature of about 450° C., under a reducing atmosphere, to assure adhesion between contact 20 and substrate 12.

After annealing of ohmic contact 20, a metal oxide semiconductor structure is begun by covering surface 22 with a thin, transparent oxide layer 24 (shown in FIG. 1c) about twenty-five angstrom units thick. Layer 24 is an electrically insulating, non-hydroscopic oxide material, such as silicon dioxide, antimony trioxide, or silicon dioxide doped with gallium trioxide. The insulating material is deposited while the substrate is maintained at about 200° C. by any well-known method, such as anodic or vacuum deposition, or spun on with using a proprietary solution of Emulsitone diluted in a fifty-to-one aliquot ratio with methyl alcohol. A native oxide layer is not used because native gallium oxide tends to be hydroscopic. Once the oxide insulating material is in place, the substrate temperature is maintained until the oxide has cured.

Figure 2:
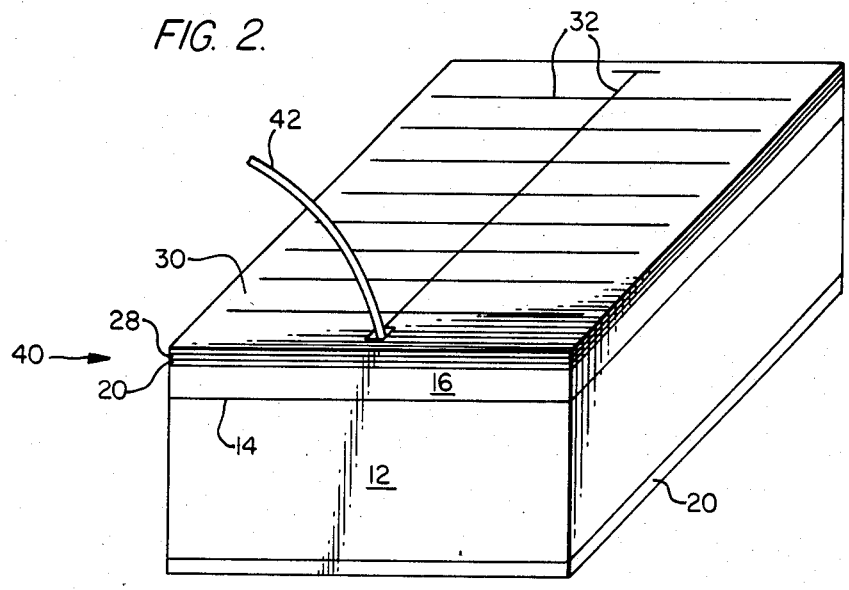
FIG. 2 is an orthogonal representation of a completed embodiment of the invention.

After curing, the oxide forms a stable, transparent, and non-hydroscopic layer 24 completely covering the epitaxial layer 16. A very thin layer 28 (shown in FIG. 1d) of a refractory metal is deposited on the oxide layer by vapor deposition to a thickness of between approximately twenty and forty angstrom units. The refractory metal is one which is transparent at thicknesses within that range, and which has a thermionic work function approximating that of gold. Nickel, which has a thermionic work function of greater than 4.5 electron-volts, and molybdenum, with a thermionic work function of greater than 4.3 electron-volts, are two suitable refractory metals. Both adhere tenaciously to oxide layer 24. Without breaking the vacuum, a layer 30 (shown in FIG. 1e) of a noble metal such as copper, silver, or gold, all of which have a very high electrical conductivity, is then deposited by vapor deposition to a thickness of between about fifty and one hundred angstrom units over refractory metal layer 28. The noble metal layer forms a Schottky barrier with the epitaxial layer 16. Both metal layers must be sufficiently thin to provide transmission of incident light. To monitor the thickness of the metal during deposition, a piezoelectric crystal (not shown) may be placed adjacent to the substrate and metal allowed to condense on the crystal during deposition. Condensation of the metal decreases the resonant frequency of the crystal, thereby enabling the amount and rate of growth of the metal layers to be accurately observed. After deposition of layers 28, 30, an interdigitated structure 32 (shown in FIG. 1f) of an electrically conducting material, such as aluminum or a sandwich of aluminum and silver, is deposited through a mask and onto the noble metal layer. The interdigitated structure is in direct electrical contact with the noble metal and, as more completely shown by FIG. 2, provides a second ohmic contact for the completed device 40 which extends across noble layer 30. A wire lead 42 is easily connectable to interdigitated structure 32 by conventional techniques, such as thermal compression bonding, without impairing the adhesion between the noble metal, refractory metal, and oxide layers.

The semiconductor device disclosed has a layer of metallization formed by growth of an intermediate refractory metal layer between the oxide and noble metal layers which assures tenacious adhesion and, therefore, continuous contact, between the oxide and noble metal layers. This adhesion facilitates coupling of the device to other devices or to external circuitry via wire leads. The thinness of the refractory metal layer, preferably about twenty-five or thirty angstrom units, permits sufficient transmission of incident radiation to compensate for any increase in electrical resistance caused by the presence of the refractory metal. Charge carriers traveling normal to the plane of the epitaxial layer tunnel through the oxide layer and travel across only the thickness of the refractory metal layer before being swept through the highly conductive noble metal layer to the nearest finger of the interdigitated ohmic contact.

Figure 3:
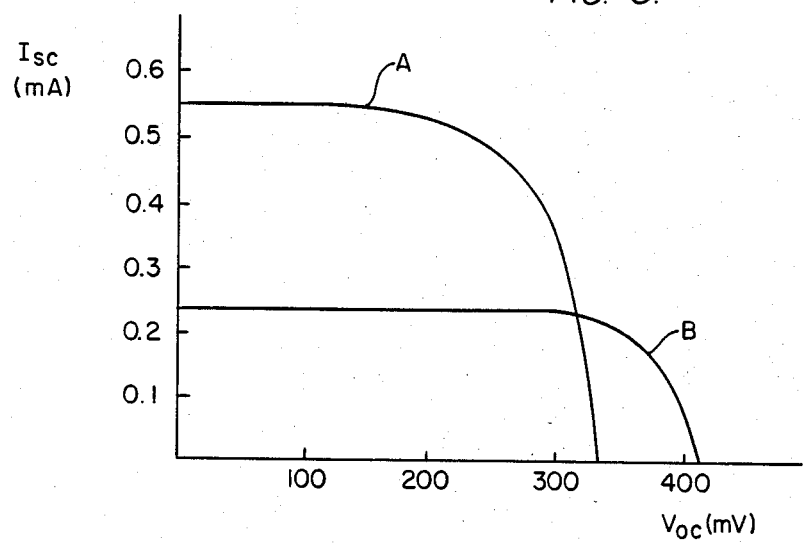
FIG. 3 is a two-coordinate graph comparing electrical characteristics of embodiments of the invention with those of a prior art device.

The composite short circuit currents for several prototype devices made according to the present invention with refractory metal layers of approximately thirty angstrom units of nickel covered by a layer of approximately sixty-five angstrom units of gold, are shown in FIG. 3 as curve A. Curve B shows the short circuit current versus open circuit voltage curve of a representative prior art device made with a gold layer separated from a gallium arsenide epitaxial layer by only an oxide insulating layer. The prototype devices represented by curve A exhibit significantly lower open circuit voltages and substantially higher short circuit currents when simultaneously exposed with the device represented by curve B to a source of light at air mass one. It is apparent that devices made with an intermediate, transparent layer of a refractory metal exhibit a lower internal voltage drop while furnishing an increased output current and, therefore, provide a substantial increase in efficiency. The increased efficiency of these devices renders them particularly useful as photovoltaic solar cells because the band gap of gallium arsenide, 1.4 electron-volts, approximates that of the solar spectrum. Moreover, the improved adhesion between the metal and oxide layers permits simple wire coupling between discrete devices, thereby enabling an array of such devices to be coupled in series to provide a high output voltage.

A photo-responsive device may also be made according to the present invention with a p-type majority charge carrier conductivity in the gallium arsenide substrate and a p+ type conductivity in the arsenide epitaxial layer. In such a device, the oxide layer is formed on the epitaxial layer and a very thin, transparent layer of an alkali earth metal having a low thermionic work function is deposited upon the oxide layer. Magnesium, an alkali earth metal which has a work function of about 3.5 electron-volts, is a particularly suitable metal because, in layers of less than about seventy angstrom units thick, it transmits incident radiation. Also, the alkali metal tenaciously adheres to the oxide layer. A thin layer of a noble metal is deposited upon the alkali earth metal layer and an ohmic contact is then formed on the noble metal layer.

We claim:

1. A photo-responsive device, comprising:
a gallium arsenide substrate (12) having an n+ type majority charge carrier concentration and a pair of opposed surfaces (14, 18);
an epitaxial layer (16) of gallium arsenide having an n type majority charge carrier concentration formed upon a first of said surfaces;
first means (20) disposed upon a second of said surfaces for providing electrical contact with said substrate;
a thin, transparent insulating layer (24) of an oxide covering said epitaxial layer;
a thin, transparent layer (28) of a refractory metal deposited upon said layer of oxide;
a thin, transparent layer (30) of a noble metal deposited upon said refractory metal layer;

said refractory metal having a high thermionic work function approximating that of said noble metal; and second means (32) disposed upon said noble metal layer for providing electrical contact with said noble metal.

2. The device of claim 1 wherein said refractory metal layer has a thickness of less than forty angstrom units.

3. The device of claim 1 wherein said refractory metal layer comprises molybdenum.

4. The device of claim 1 wherein said refractory metal layer comprises nickel.

5. A method of making a photo-responsive device, comprising the steps of:

growing an epitaxial layer (16) of gallium arsenide having an n type charge carrier concentration upon a first surface of a substrate (12) of gallium arsenide having an n+ type charge carrier concentration and a second surface opposed to said first surface;

applying an ohmic contact (20) to said second surface;

forming a thin, transparent insulating layer (24) of an oxide upon said epitaxial layer;

depositing a thin, transparent layer (28) of a refractory metal upon said layer of oxide;

depositing a thin, transparent layer (30) of a noble metal upon said refractory metal layer having a high thermionic work function approximating that of said refractory metal; and forming an ohmic contact (32) upon said thin layer.

6. The method of claim 9 wherein said refractory metal layer is deposited to a thickness of not more than forty angstrom units.

7. The method of claim 5 wherein said refractory metal layer comprises molybdenum.

8. The method of claim 5 wherein said refractory metal layer comprises nickel.

* * * * *